United States Patent [19]

Scheetz

[11] Patent Number: 4,794,018

[45] Date of Patent: Dec. 27, 1988

[54] PARTIAL IMMERSION FLOW COATING METHOD AND APPARATUS

[76] Inventor: Frederick M. Scheetz, 2013 East Carter, Kokomo, Ind. 46901

[21] Appl. No.: 82,741

[22] Filed: Aug. 7, 1987

[51] Int. Cl.⁴ .................................................. B05D 5/12
[52] U.S. Cl. ...................................... 427/96; 118/410; 118/412; 118/407; 118/413; 118/421; 118/429
[58] Field of Search .................. 427/96; 118/429, 412, 118/410, 413, 407, 421

[56] References Cited

U.S. PATENT DOCUMENTS

| | | | |
|---|---|---|---|
| 171,688 | 1/1876 | Morewood | 118/429 |
| 3,605,689 | 9/1971 | Sherwood | 118/407 |
| 3,824,954 | 7/1974 | Hyosaka | 118/429 |
| 4,204,498 | 5/1980 | Ivancic | 118/421 |
| 4,317,845 | 3/1982 | Karasawa | 118/421 |
| 4,418,641 | 12/1983 | Nakashima | 118/429 |
| 4,465,014 | 8/1984 | Bajka | 118/114 |
| 4,539,931 | 9/1985 | Kikuta | 118/404 |

Primary Examiner—Shrive Beck
Assistant Examiner—Vi D. Dang
Attorney, Agent, or Firm—Baker & Daniels

[57] ABSTRACT

Apparatus and method for applying a coating material to a workpiece. The apparatus includes a coating material flow surface capable of supporting the workpiece. A coating material flow source provides substantially even flow of the coating material across the flow surface. The flow volume may be controlled by suitable means such as a variable speed pump. After flowing over the flow surface, the coating material drains into a drain vat. Portions of the workpiece to which coating should not be applied can be prevented from contacting the coating material by placing those portions over a drain edge of the flow surface.

11 Claims, 3 Drawing Sheets

PARTIAL IMMERSION FLOW COATING METHOD AND APPARATUS

FIELD OF THE INVENTION

This invention relates to an apparatus and method for applying a coating of material to a workpiece, such as an assembled printed circuit board, by partially immersing the workpiece in a flow of the coating substance. In addition, the invention relates to a method whereby selected perimeter portions of a workpiece may be excluded from the coating process.

BACKGROUND

It is often desirable to place a partial coating of protective material on workpieces such as assembled printed circuit ("PC") boards. Such coatings generally provide several functions, such as preventing short circuits caused by stray conductive debris and providing insulation against extreme temperatures and vibration.

One objective when applying such coatings is to avoid the introduction of the coating material into electronic components which may be adversely affected by the coating. Such components include, for example, potentiometers, variable capacitors, and other components with moving parts, as well as heat sinks and the like whose heat dissipation characteristics are hindered by coating material. Thus, it is generally desirable to coat the bottom of a PC board where soldering connections are made, and to also apply a thin or "shallow" coating to the top of the board where the components are attached to the board. However, the coating should not be allowed to "wick up" the components. In addition, coating should be excluded from any component, wherever located, which may be adversely affected by the coating.

Many techniques are known to accomplish such an application of a coating, but none are completely satisfactory. For example, coating may be sprayed on a PC board, but it is difficult, even with stencils and shields covering the board, to prevent the coating from getting on components which should not receive coating. In addition, spraying does not allow a thin layer of coating material to be placed on the upper surface of a board without also entirely coating the components. Another method is to partially immerse the board in a bath of coating material by placing it on supports in the bath. The supports allow the board to be submerged to a depth sufficient to coat the bottom and a slight amount of the top of the board. However, air bubbles can prevent the complete coating of bottom portions of a board, the coating tends to "wick up" the components on the board, the boards are subject to being accidentally immersed in the coating material when the board is being inserted or removed from the bath of coating material, and this submersion process is generally time-consuming. Other coating methods and apparatuses must be designed for a workpiece of a particular shape, but these may not allow convenient substitution of differently sized workpieces.

SUMMARY OF THE INVENTION

Accordingly, it is an object of the invention to provide a method and device for partially coating workpieces which allows selected portions of the workpiece to be excluded from the coating process.

It is another object of the invention to provide a method and device for partially coating workpieces which reduces waste of coating material.

It is another object of the invention to provide a method and device for partially coating workpieces which can be easily adapted for differently shaped workpieces.

It is another object of the invention to provide a method and device for partially coating workpieces which allows quick and economical coating of workpieces.

DESCRIPTION OF THE PREFERRED EMBODIMENT

Figure 1:
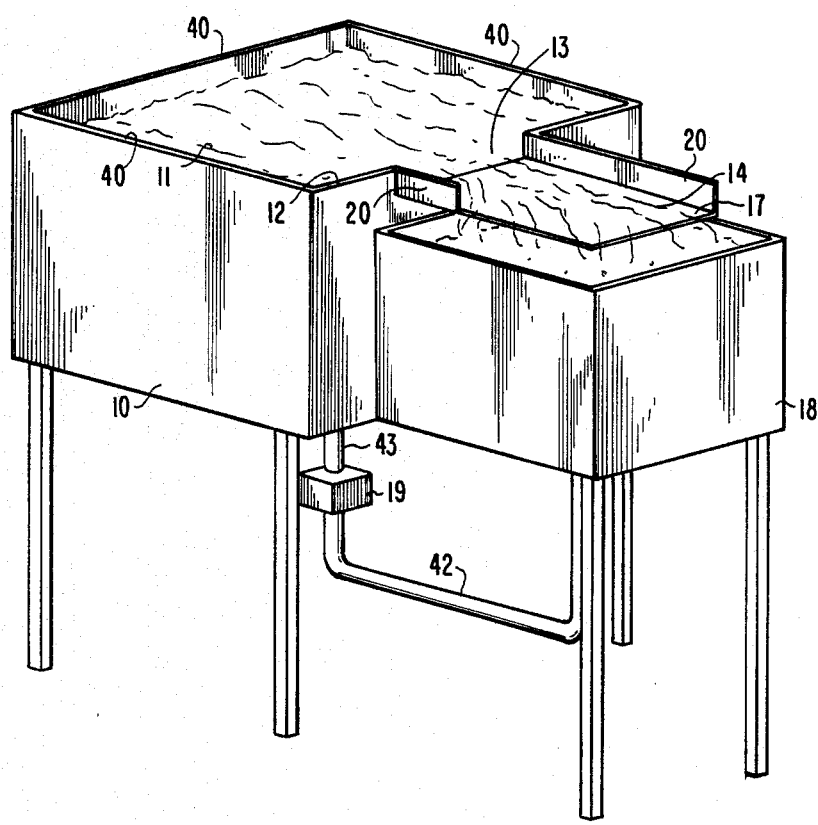
FIG. 1 is a perspective view of the apparatus of the invention.

FIG. 1 is a perspective view of the apparatus of the invention. Vat 10 holds coating material 11. For coating PC boards, the coating may be 1-2577 conformal coating, manufactured by Dow Corning of Midland, Mich. Three of the side walls 40 of vat 10 are higher than the fourth wall 12. Fourth wall 12 has a cut away portion 13 which acts as a flow source to introduce coating material 11 onto flow surface 14. Alternatively, the entire length of fourth wall 40 may be lower than the remaining side walls 40, and the guide walls 20 of flow surface 14 may perpendicularly extend above flow surface 14 of fourth wall 12 to control the width of the flow source area. Flow surface 14 is of a sufficient size and shape to support article (not shown) to be partially coated. Flowing coating material 17 flows from vat 10 across flow surface 14 and drains into drain tank 18, which is generally larger in surface area than flow surface 14 so that all flowing coating material flowing from the flow surface 14 flows into drain tank 18. Drain tank 18 is connected via pipes 42 and 43, and pump 19 to vat 10 to provide constant recirculation of coating material 11, which helps to prevent coagulation of the coating material. A mesh screen (not shown) may be placed over the pipe outlet of drain tank 18 to prevent debris from entering pipe 42. Also, pipe 42 may include an enclosed storage tank (not shown) to hold the coating material when it is not in use.

The pumping volume of pump 19 may be adjusted via controls (not shown) to accurately control the thickness of the flowing coating material 17 generated by the flow source. The depth should be adjusted to be equal to the desired thickness of coating on the article to be coated.

Guide walls 20 prevent flowing coating material 17 from prematurely flowing into drain tank 18 before coating an article placed on flow surface 14, and thus provide an even depth of flowing coating material 17 over the entire flow surface 14.

Figure 2:
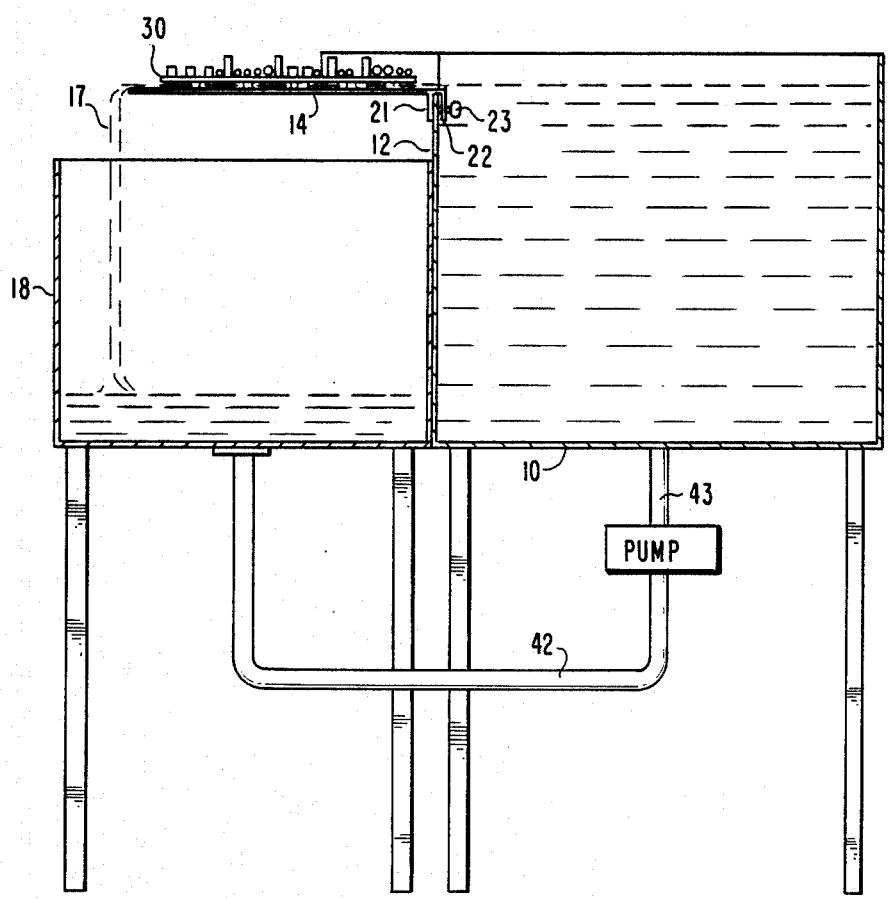
FIG. 2 is a vertical sectional view of the apparatus of the invention.

FIG. 2 is a vertical sectional view of the apparatus of the invention. Flow surface 14 is attached to vat 10 by pair of horizontally space flanges 21 and 22 which fit over the fourth wall 12 of vat 10. Secure attachment thereto is provided by a pair of thumbscrews 23, which also allow quick replacement of flow surface 14. Thus, the apparatus of the invention allows the size and shape of the flow surface to be easily replaced to accommodate articles of different sizes and shapes.

The depth of flowing coating material 17 may be adjusted to give the desired thickness. For example, printed circuit board 30 may be placed on flow surface 14 and the flow volume is adjusted so that flowing coating material 17 is thick enough to coat the bottom of board 30 and a thin layer on the top of the board.

The speed of the flow of coating material along flow surface 14 may also be controlled by inclining the flow surface so that gravity provides an additional method of drawing coating material toward drain tank 18. Such inclination may be accomplished by either incorporating it into the design of the flow surface, or by loosening thumbscrews 23 securing the flow surface 14 to vat 10, and allowing the flow surface to slightly tilt downwards.

Figure 3:
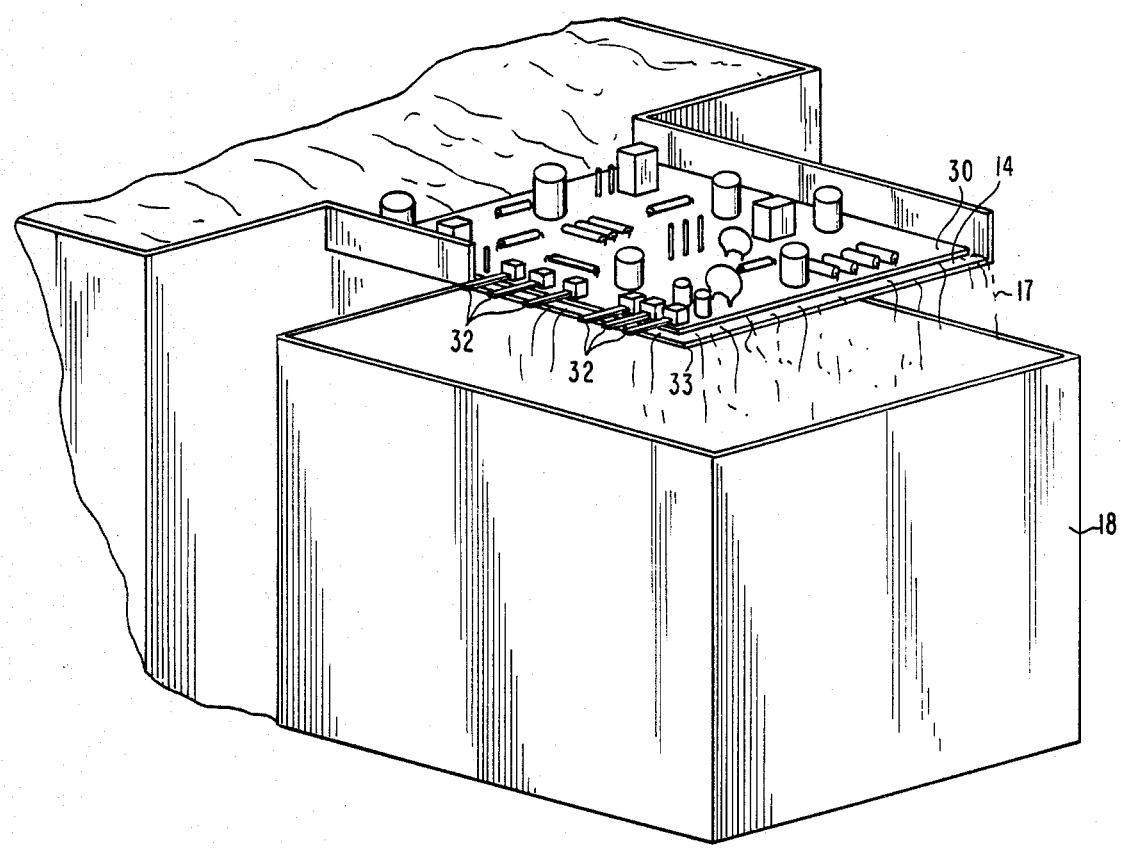
FIG. 3 is a perspective view of a printed circuit board with a peripheral edge which should not be coated placed in the apparatus of the invention.

FIG. 3 is a perspective view of a printed circuit board with a peripheral edge which should not be coated, situated in the apparatus of the invention. A primary feature of the invention is that it allows peripheral edges of articles to be excluded from the coating process at will. This is particularly convenient for coating articles such as printed circuit boards which often have components with moving parts such as potentiometers which can be damaged if they come into contact with coating material.

Printed circuit board 30 has components which may receive coating material, and components 32 which are to remain uncoated. Flow surface 14 is designed so that components 32 extends beyond the edge 33 of flow surface 14. Thus, flowing coating material 17 drains into drain tank 18 without coating components 32. It may thus be appreciated that the flow surface 14 and guide walls 20 may be manufactured in any desired shape to accommodate boards of various sizes and shapes, and having peripheral edge portions that should not receive coating in various locations.

Figure 4:
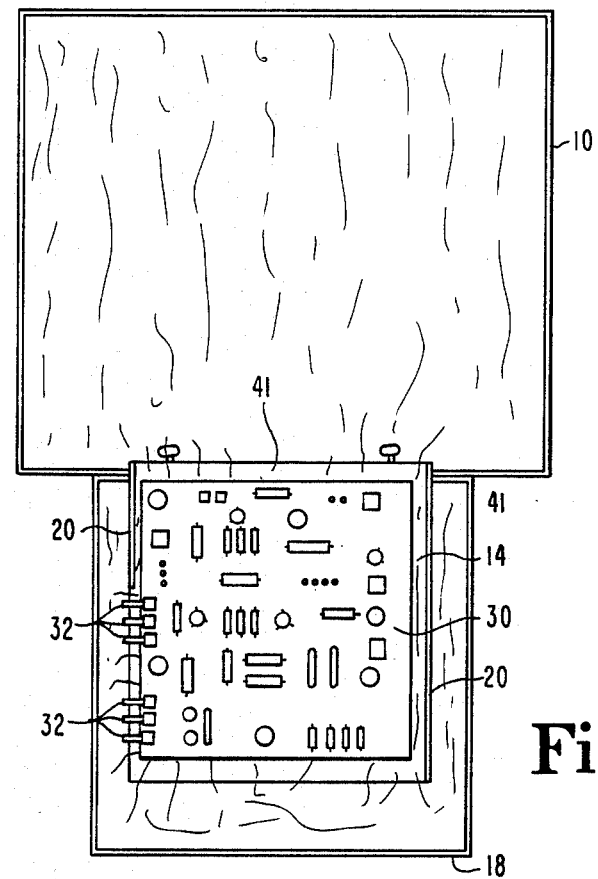
FIG. 4 is a top view of the apparatus of the invention.

FIG. 4 is a top view of the apparatus of the invention showing the relative dimensions of the coating material vat 10, flow surface 14 and drain tank 18. The width of vat 10 should be at least as wide as flow surface 14 to provide a flow of coating material along the entire width of flow surface 14. However, it should be understood that the apparatus of the invention does not require the use of an overflow vat as the source for the flow of coating material. For example, a slotted feed line (not shown) such as that disclosed in U.S. Pat. No. 3,605,689 may also be placed at the front edge 41 of flow surface 14.

Ideally, the sides of drain tank 18 should extend beyond the sides of flow surface 14 so that all coating material flowing off the flow surface enters drain tank 18.

It may also be appreciated from FIG. 4 that components 32 on printed circuit board 30 that should not be coated extend beyond the edge of flow surface 14, and that guide walls 20 serve to maintain an even coating depth along the entire width of flow surface 14.

To apply a partial coating of material to an article in accordance with the invention, it is first necessary to determine the size of the article to be coated and thickness of coating. A flow surface as described above should be manufactured using techniques well-known in the art to accommodate the size and shape of the article. If any peripheral edges of the article are not to be coated, then the portion of the flow surface that would otherwise support such portions should be cut away to allow such portions to extend beyond the edge of the flow surface. The flow surface may be attached to a suitable coating material flow source. The flow volume should then be adjusted so that the depth of the flow across the flow surface is equal to the thickness of coating desired on the article to be coated. The article is then placed on the flow surface, and is coated by the flow of coating material. The article is removed from the flow surface, and may be hung for drying or other desired processing.

It may be appreciated that the foregoing description of the preferred embodiment is only an example of the invention claimed, and should not be construed as limiting in any way other variations which may be employed without departing from the spirit or scope of the invention.

I claim:

1. An apparatus for applying coating material to a workpiece comprising: a coating material flow surface capable of supporting the workpiece; a coating material flow source capable of generating a flow of coating material onto the flow surface; means for controlling the volume of coating material from the flow source; drain means from said coating material flow surface for draining excess coating material; and upwardly extending walls on the edges of said flow surface capable of guiding the flow of the coating material.

2. The apparatus of claim 1 further comprising:
   cut-out sections of said walls capable of accommodating peripheral edge portions of a workpiece which should not receive coating material.

3. The apparatus of claim 1 further comprising:
   coating material transfer means for transferring the coating material from said drain means to said flow source means.

4. The apparatus of claim 3 wherein the coating material transfer means icludes said means for controlling the volume of coating material from the flow source.

5. The apparatus of claim 1 further comprising means for connecting and detaching said flow surface from said flow source.

6. An apparatus for applying coating material to a workpiece comprising: a coating material flow surface capable of supporting the workpiece; a coating material flow source capable of generating a flow of coating material onto the flow surface; means for controlling the volume of coating material from the flow source; and drain means from said coating material flow surface for draining excess coating material wherein said flow surface is inclined from the drain means toward the flow source means.

7. An apparatus for applying coating material to a workpiece comprising: a coating material flow surface capable of supporting the workpiece; a coating material flow source capable of generating a flow of coating material onto the flow surface wherein said flow source comprises a vat of coating material having a reduced-height wall portion over which said coating material may flow onto the flow surface; means for controlling the volume of coating material from the flow source; and drain means from said coating material flow surface for draining excess coating material.

8. An apparatus for applying coating material to a printed circuit board, said printed circuit board having at least one peripheral edge portion to which coating should not be applied, comprising:
   a coating material flow surface capable of supporting the printed circuit board;

a coating material flow source capable of generating a flow of coating material onto the flow surface;

means for controlling the volume of coating material from the flow source;

upwardly extending walls on the edges of said flow surface capable of guiding the flow of the coating material, said walls having cut-out portions to allow those peripheral edge portions of the printed circuit board to which coating should not be applied to extend beyond the edge of the flow surface; and drain means from said coating material flow surface for draining excess coating material.

9. A method for coating a lower portion of a workpiece with a coating material comprising:

providing a flow of coating material to a flow surface capable of supporting the workpiece and having at least one drain edge;

adjusting the volume of flow of coating material so that the depth of the flow matches the height of coating material desired on the workpiece;

placing the workpiece on the flow surface so that the portion to be coated is immersed in coating material;

removing the workpiece from the flow surface.

10. The method of claim 9 wherein the workpiece is a printed circuit board.

11. The method of claim 9 applied to a workpiece to be coated that includes at least one edge portion which should not be coated, wherein the workpiece is positioned on the flow surface such that the edge portions of the workpiece that are not to be coated extend beyond the drain edge of the flow surface.

* * * * *

UNITED STATES PATENT AND TRADEMARK OFFICE
CERTIFICATE OF CORRECTION

PATENT NO. : 4,794,018
DATED : 27 December, 1988
INVENTOR(S) : SCHEETZ, Frederick M.

It is certified that error appears in the above—identified patent and that said Letters Patent is hereby corrected as shown below:

In column 4, line 37, change "icludes" to --includes--.

Signed and Sealed this

Twenty-fifth Day of April, 1989

Attest:

DONALD J. QUIGG

Attesting Officer     Commissioner of Patents and Trademarks